US006953609B2

(12) United States Patent
Carollo

(10) Patent No.: US 6,953,609 B2
(45) Date of Patent: Oct. 11, 2005

(54) HIGH-DENSITY PLASMA PROCESS FOR DEPOSITING A LAYER OF SILICON NITRIDE

(75) Inventor: Enzo Carollo, Brugherio (IT)

(73) Assignee: STMicroelectronics S.r.l. (IT)

( * ) Notice: Subject to any disclaimer, the term of this patent is extended or adjusted under 35 U.S.C. 154(b) by 25 days.

(21) Appl. No.: 10/686,556

(22) Filed: Oct. 14, 2003

(65) Prior Publication Data

US 2004/0137169 A1 Jul. 15, 2004

(30) Foreign Application Priority Data

Oct. 11, 2002 (EP) ........................................... 02425615

(51) Int. Cl.[7] ................................................ H05H 1/24

(52) U.S. Cl. .................. 427/579; 427/255.37; 427/535; 438/789

(58) Field of Search ............................ 427/579, 255.37, 427/535; 438/789

(56) References Cited

U.S. PATENT DOCUMENTS 6,133,096 A * 10/2000 Su et al. ..................... 438/264
6,368,988 B1 * 4/2002 Li et al. ..................... 438/792

FOREIGN PATENT DOCUMENTS

EP 1 111 664 A2 6/2001
EP 1 168 427 A1 1/2002
EP 1168427 A1 * 1/2002

OTHER PUBLICATIONS

J. Yota, et al., "Comparison Between HDP CVD and PECVD Silicon Nitride for Advanced Interconnect Applications", 0–7803–6327–2/00 2000 IEEE, pp. 76–78.

J. Yota, et al., "Comparitive Study on Inductively–coupled Plasma High–density Plasma, Plasma–enhanced, and Low Pressure Chemical Vapor Deposition Silicon Nitride Films", J. Vac. Sci. Technol. A 18(2) Mar./Apr. 2000 0734–2101/2000/18(2)/372/5 2000 American Vacuum Society, pp. 372–375.

S. V. Nguyen, "High–density Plasma Chemical Vapor Deposition of Silicon–based Dielectric Films for Integrated Circuits", 0018–8646/99 1999 IBM, 21 pages.

European Search Report for EP 02 42 5615 dated May 7, 2003.

* cited by examiner

*Primary Examiner*—Bret Chen
(74) *Attorney, Agent, or Firm*—Lisa K. Jorgenson; Paul F. Rusyn; Graybeal Jackson Haley LLP

(57) ABSTRACT

A high-density plasma process is proposed for depositing a layer of Silicon Nitride on a substrate in a plasma reactor. The process includes the steps of: providing a gas including precursor components of the Silicon Nitride, generating a plasma applying a radio-frequency power to the gas, and the plasma reacting with the substrate to deposit the layer of Silicon Nitride. The power applied to the gas is in the range from 2.5 kW to 4 kW.

9 Claims, 3 Drawing Sheets

HIGH-DENSITY PLASMA PROCESS FOR DEPOSITING A LAYER OF SILICON NITRIDE

PRIORITY CLAIM

This application claims priority from European patent application No. 02425615.8, filed Oct. 11, 2002, which is incorporated herein by reference.

TECHNICAL FIELD

The present invention relates generally to a high-density plasma process for depositing a layer of Silicon Nitride.

BACKGROUND

Silicon Nitride ($Si_3N_4$) is widely used in the fabrication of integrated circuits; for example, the Silicon Nitride finds application as a final passivation film, a mechanical protective structure, an etching stop layer, a hard-mask, a diffusion barrier, an anti-reflective coating, a gate or spacer dielectric, and so on.

Several methods are known in the art for depositing a layer of Silicon Nitride on a wafer of semiconductor material. In the Low Pressure Chemical Vapor Deposition (LPCVD) technique, the Silicon Nitride is deposited in a furnace at low pressure (0.1–0.2 Torr) and high temperature (700–900° C.). However, the deposition temperature is not compatible with many fabrication processes of the integrated circuits.

A different method is based on the Plasma Enhanced CVD (PECVD) technique. In this case, the Silicon Nitride is deposited using a plasma reactor, wherein precursor components of the Silicon Nitride are injected. A plasma is then generated using a Radio-Frequency (RF) power source working at 50 kHz–15 MHz, while the plasma is kept at a pressure of 0.1–10 Torr; the resulting plasma has a (relatively) low electron density, typically in the range from $10^8$ to $10^{10}$ n/cm$^3$.

The PECVD Silicon Nitride features good electrical qualities. However, its morphological characteristics create several problems in some applications. Particularly, the PECVD process is isotropic; therefore, the PECVD Silicon Nitride has a low filling capability. Moreover, the layers deposited with the PECVD technique show bumps in the area on or near any corner and step structure.

A new method recently investigated for depositing Silicon Nitride is based on the High-Density Plasma CVD (HDP CVD) technique. This technique uses a reactor with one or two RF power sources that work at high frequency (for example, 1–5 MHz), and wherein the plasma is kept at very low pressure (for example, 0.5–50 mTorr). As a result, the plasma in the HDP CVD process has a high-density, typically in the range from $10^{11}$ to $10^{12}$ n/cm$^3$.

The HDP CVD Silicon Nitride features good morphological qualities. In fact, the HDP CVD process is anisotropic; therefore, the HDP CVD Silicon Nitride has a high filling capability. Moreover, in the HDP CVD process a sputter-etching (caused by an RF biasing power source working at very high frequency, such as 13.56 MHz) is simultaneous with the deposition; in this way, any bumps in the area on or near corners and step structures are removed.

Examples of methods for depositing Silicon Nitride using the HDP CVD technique are disclosed in "Comparison between HDP CVD and PECVD Silicon Nitride for Advanced Interconnect Applications", J.Yota et al., 0-7803-

6327-2/00 2000 IEEE, pages 76–78 and in "A comparative study on inductively-coupled plasma high-density plasma, plasma-enhanced, and low pressure chemical vapor deposition silicon nitride films", J.Yota et al., J.Vac.Sci. Technol. A 18(2) March/April 2000 0734-2101/2000/18(2)/372/5 2000 American Vacuum Society, pages 372–375. Both documents, which are incorporated by reference, propose HDP CVD processes that are specifically designed to obtain Silicon Nitride with a composition almost stoichiometric (i.e., about 43% of Silicon and about 57% of Nitrogen); in any case, the amount of Hydrogen in the Silicon Nitride is kept as low as possible.

A drawback of the HDP CVD Silicon Nitride is that it features very poor electrical qualities. Particularly, the HDP CVD Silicon Nitride has a reduced breakdown strength; this adversely affects the reliability of the active oxides in MOS transistors. Moreover, the HDP CVD Silicon Nitride significantly increases a threshold voltage of the transistors. This prevents the exploitation of the HDP CVD Silicon Nitride in several applications.

SUMMARY

An embodiment of the present invention overcomes the above-mentioned drawbacks.

Briefly, this embodiment of the present invention provides a high-density plasma process for depositing a layer of Silicon Nitride on a substrate in a plasma reactor, the process including the steps of: providing a gas including precursor components of the Silicon Nitride, generating a plasma applying a radio-frequency power to the gas, and the plasma reacting with the substrate to deposit the layer of Silicon Nitride, wherein the power applied to the gas is in the range from 2.5 kW to 4 kW.

BRIEF DESCRIPTION OF THE DRAWINGS

Further features and the advantages of the present invention will be made clear by the following description of a preferred embodiment thereof, given purely by way of a non-restrictive indication, with reference to the attached figures, in which.

DETAILED DESCRIPTION

Figure 1:
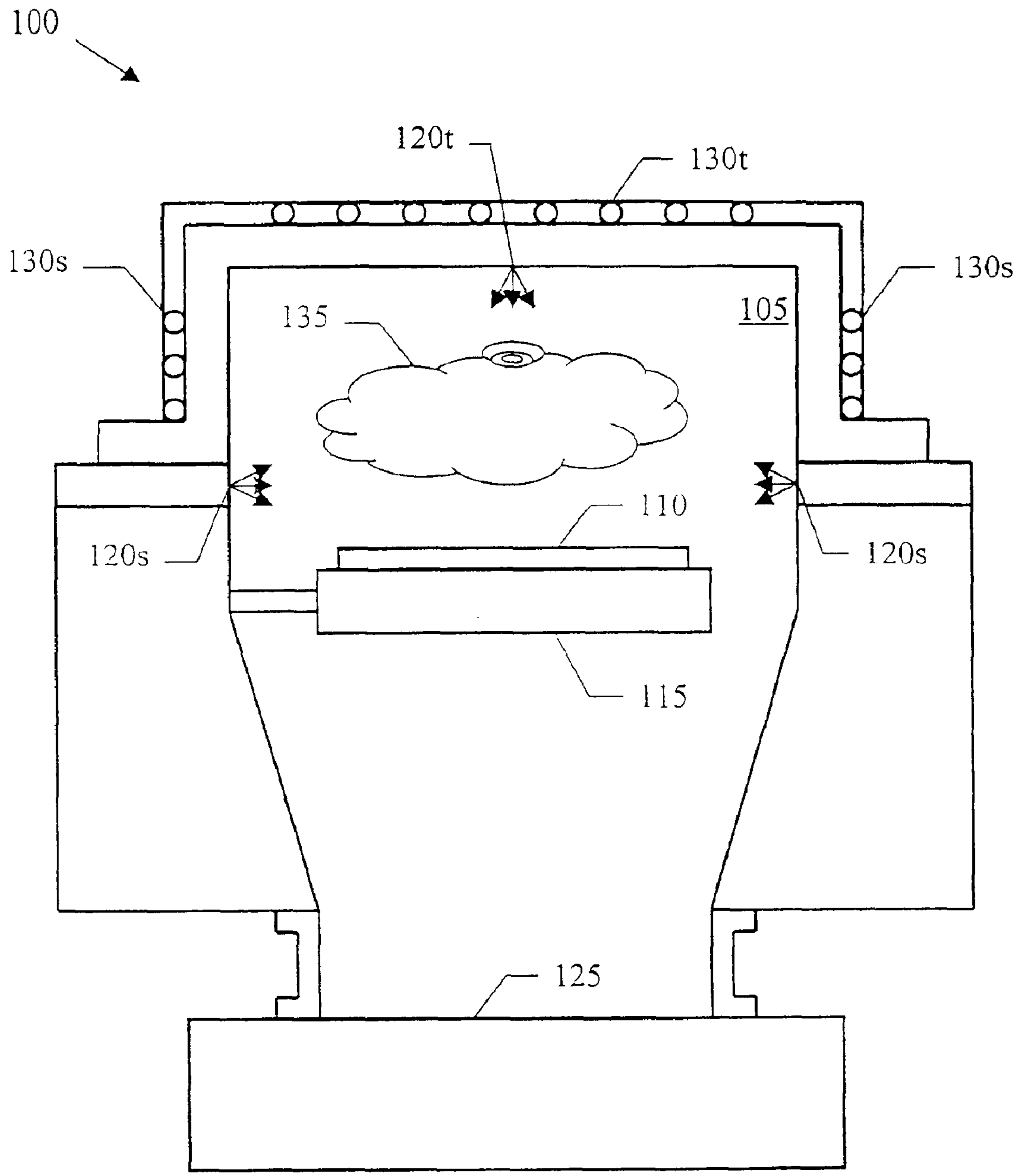
FIG. 1 is a schematic representation of a plasma reactor wherein a process according to an embodiment of the invention can be used.

With reference in particular to FIG. 1, a HDP reactor 100 is illustrated according to an embodiment of the invention. The reactor 100 includes an airtight process chamber 105. The chamber 105 houses a wafer of semiconductor material 110, which rests on a support 115. A set of top nozzles 120*t* and a set of side nozzles 120*s* (each one connected to a corresponding gas line with a mass flow controller, not shown in the figure) are used to inject desired amounts of different components of a gas into the chamber 105. Generally, the flow rate of each component is about 50–60% of a rated value that is supported by the reactor 100.

The gas inside the chamber 105 is kept at very low pressure (0.5–50 mTorr) by means of a turbo-molecular pump 125 (which is also used to evacuate the chamber 105). A high electromagnetic field is then applied so as to cause the dissociation and/or ionization of the gas. For this purpose, the reactor 100 includes a top power source 130*t* and a side power source 130*s*. The top power source 130*t* includes an RF generator that is arranged in the shape of a helicoid, whereas the side power source 130*s* includes an RF generator that is arranged as a solenoid. Both power sources 130*t* and 130*s* work at high frequency (1–5 MHz). Generally, the two power sources are dimensioned so that the side power source 130*s* provides a power that is twice the one provided by the top power source 130*t*.

As a consequence, a plasma 135 is generated in the chamber 105 (with a simultaneous glow discharge); the plasma 135 includes positive and negative ions, neutral radicals, free electrons and different compounds obtained from the dissociation and/or combination of the original constituents of the gas. The characteristics of the reactor 100 result in an increased ionization rate (0.1–10%) and dissociation rate (>50%) of the gas; as a consequence, the plasma 135 features a high electron density, in the range from $10^{11}$ to $10^{12}$ n/cm$^3$.

The plasma 135 reacts with the wafer 110 placed on the support 115, so as to carry out the desired process (such as the deposition of a film of semiconductor material). Typically, the reactor does not include any heating element; the wafer 110 is initially brought to the desired temperature (normally in the range from 300° C. to 400° C.) using a suitable plasma.

The support 115 also acts as an electrode of a biasing power source. The biasing source works at very high frequency, typically in the range from 10 to 30 MHz (such as 13.56 MHz); in some applications, the power sources are also denoted with low frequency sources and the biasing source is denoted with high frequency source. The biasing source creates a significant ion bombardment on the wafer 110, resulting in a sputter-etching thereof (simultaneously with the deposition process). The etching generates a large amount of heat that must be removed from the wafer 110.

For this purpose, the support 115 implements an Electro-Static Chuck (ESC) that holds the wafer 110 firmly (without any mechanical clamp). Particularly, the ESC 115 is charged positively or negatively (for example, with a direct voltage of 950V with respect to a reference value, or ground); as a consequence, an attractive electrostatic force is generated between the ESC 115 and the wafer 110. The plasma 135 provides the conductive pathway to ground (either when the wafer is chucked applying the direct voltage or when it is de-chucked removing the direct voltage). Moreover, the support 115 is provided with an Independent Helium Cooling (IHC) system. The IHC system consists of two rings of nozzles, which are used to eject a flow of Helium against a bottom surface of the wafer 110.

In this way, the temperature inside the wafer 110 is always maintained at low value, irrespective of the temperature of its upper surface. Therefore, any damage to the internal structures of the wafer 110 is prevented. Moreover, the above-described structure of the support 115 ensures a high and uniform heat transfer from the wafer 110.

In the application at issue, the reactor 100 is used for depositing a film of Silicon Nitride (for example, with a thickness of 3–8 knm) from a plasma including corresponding precursor components (in a suitable dilution gas). The morphological and electrical characteristics of the deposited film are affected by the infinite combinations of the different parameters of the process, such as the wafer temperature, the gas composition, the power applied, the flow rates of the constituents of the gas, the deposition pressure, and so on.

Similar considerations apply if the reactor has another structure (for example, including a single dome-shaped source power), if the electrostatic chuck is of the bipolar type (with two different zones that are appositely charged, so as not to require the plasma for chucking and de-chucking the wafer), if the layer of Silicon Nitride is deposited on an equivalent substrate or with a different thickness, and the like.

Figure 2A:
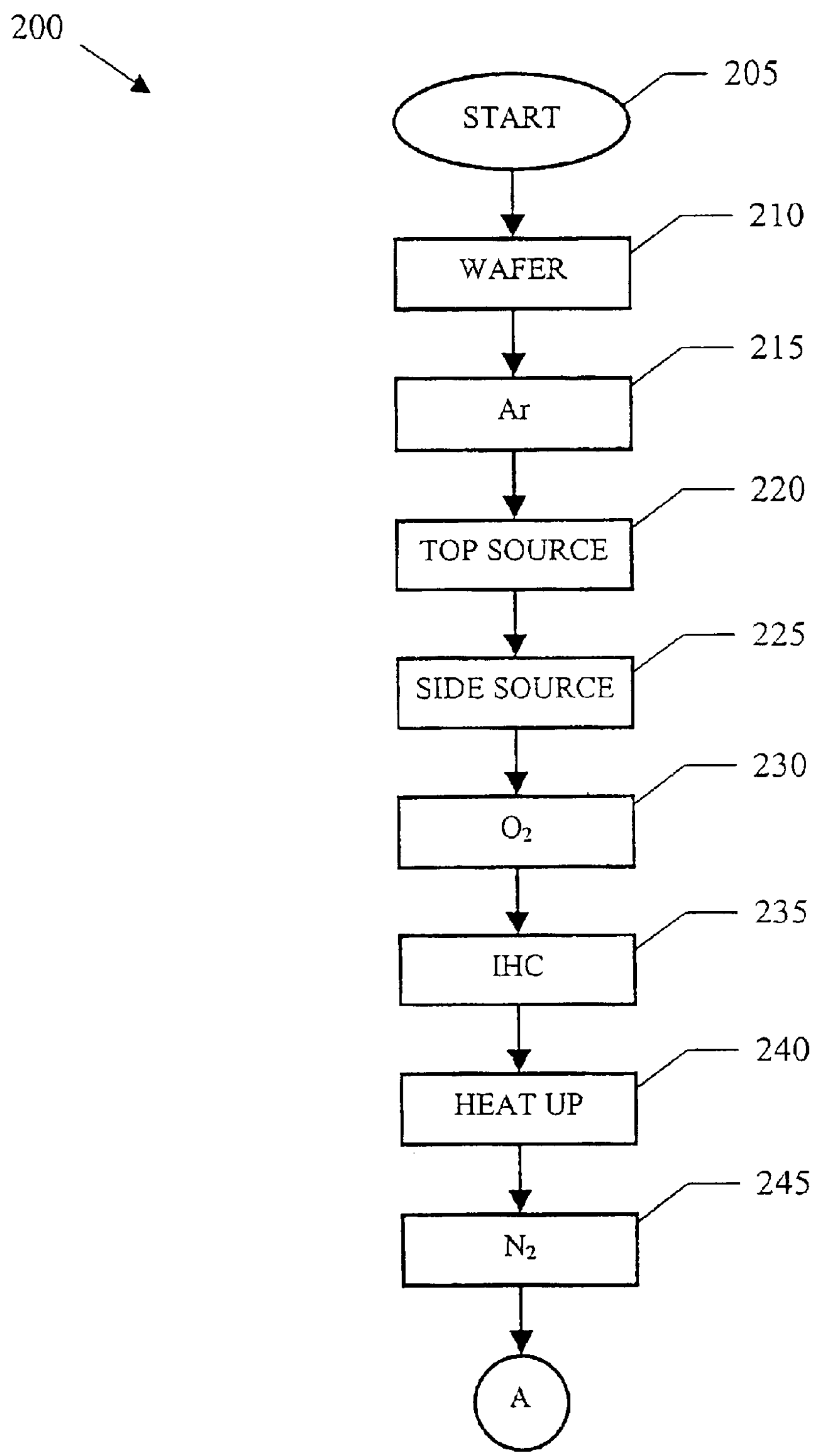
FIGS. 2*a* and 2*b* show the flow of a process for depositing a layer of Silicon Nitride according to an embodiment of the invention.
Figure 2B:
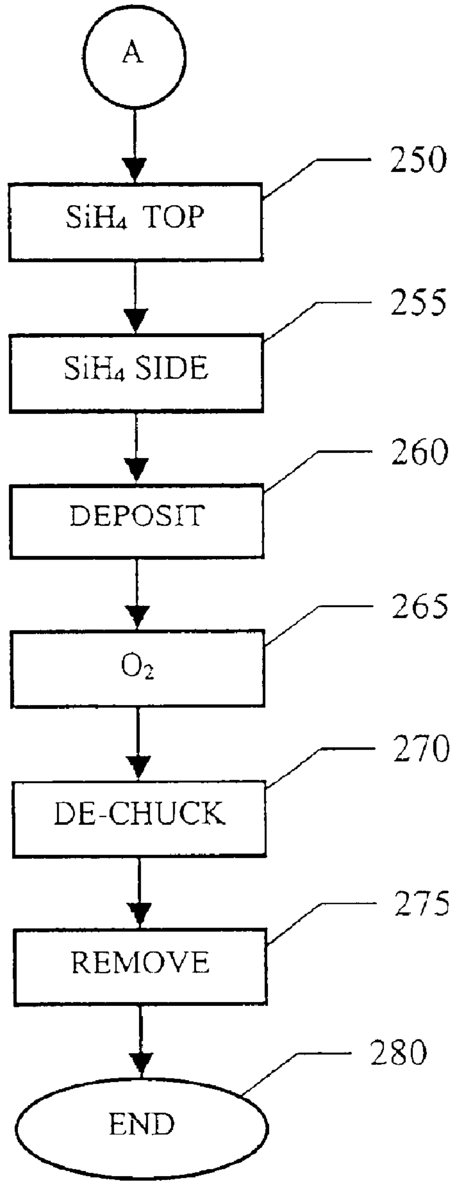

Considering now FIGS. 2*a* and 2*b*, the steps of a HDP CVD process 200 for obtaining a film of Silicon Nitride are shown according to an embodiment of the invention. The process starts at block 205 and then passes to block 210, wherein the wafer is placed in the chamber of the reactor and chucked. A heat-up phase is initiated injecting Argon (Ar) into the chamber at block 215. For example, the flow rate of the Argon at the top is set to 16 sccm and the flow rate of the Argon at the side is set to 110 sccm; these flow rates will be maintained throughout the overall process. The process step ends as soon as the gas reaches a relatively high pressure (for example, 40 mTorr), so as to facilitate the generation of the plasma. The plasma is then stricken at first switching on the top power source at block 220 (being more efficient when working alone); after a few seconds, the side power source is switched on as well at block 225 (to improve the uniformity of the plasma), opening the turbo pump at the same time (the biasing source is always off).

The total power applied to the gas has a relatively low value. More specifically, the power is in the range from 2.5 kW to 4 kW, and preferably from 2.9 kW to 3.2 kW. This power is shared between the side power source and the top power source with a ratio in the range from 2.1 to 2.5, and preferably from 2.2 to 2.4.

This result may be obtained exploiting the 33%–53%, and preferably the 39%–43%, of the total rated power supported by the top and side power sources; these percentages generate an average density of the power (with respect of a volume of the chamber) in the range from 6.4 W/cm$^3$ to 9.5 W/cm$^3$, and preferably from 7.1 W/cm$^3$ to 8.8 W/cm$^3$.

For example, in a chamber of 400 cm$^3$ (wherein the rated values supported by the top power source and by the side power source are 2.5 kW and 5 kW, respectively), the top power source applies 0.90 kW and the side power source applies 2.2 kW to the gas.

The process continues to block 230, wherein Oxygen ($O_2$) is injected into the chamber (in addition to the Argon). For example, the side flow rate of the Oxygen is set to 110 sccm (no Oxygen is injected from the top nozzles, since it would not have enough time to dissociate because of its low reactivity). Proceeding to block 235, the IHC system is switched on. The wafer is always cooled throughout the overall process (whenever the power sources are on). The wafer is then heated-up at block 240 for about 30–60 s, so as to reach the desired temperature for a next deposition phase; at the same time, the Oxygen reacts with the wafer thereby forming a superficial oxide layer. At the end of the heat-up phase, the Oxygen nozzles are closed.

The precursor components of the Silicon Nitride are then injected into the chamber, starting with Nitrogen ($N_2$) from the side nozzles at block 245 (no Nitrogen is injected from the top nozzles). Proceeding to block 250, Silane ($SiH_4$) is injected from the top nozzles. This step takes a few seconds (for example, 5–8 s), so as to deposit a liner of Silicon Nitride that is thicker in its central area than it is in its peripheral area. The process continues to block 255, wherein Silane is also injected from the side nozzles.

The ratio between the flow rate of the Nitrogen and the (total) flow rate of the Silane is typically 12.8–13.2. Preferably, the flow rates of both components are set to very high values, in the range from 80% to 95% of their rated values. For example, let us assume that the rated value for the Nitrogen is 480 sccm and that the rated value for the Silane is 35 sccm; in this case, the (side) flow rate of the Nitrogen is set to 400 sccm, whereas the side flow rate and the top flow rate of the Silane are set to 28 sccm and to 2 sccm, respectively.

The steps described above make it possible to compensate for the non-uniformity of the next deposition phase (so as to improve the profile of the resulting film of Silicon Nitride). However, experimental results have shown that the uniformity of the film does not affects its electrical characteristics; conversely, the step of depositing the liner of Silicon Nitride reduces the yield of the deposition process. Therefore, in a preferred embodiment of the invention this step is omitted (however, it can be exploited to affect the profile of the deposited film as desired).

The Silicon Nitride is now deposited at block 260. The deposition is carried out at low pressure (for example, 7.5 mTorr) for some tens of seconds (typically 30–60 s). It should be noted that the plasma is maintained stricken while the precursor components are injected into the chamber. This impairs the uniformity of the deposited film; however, the electrical characteristics of the film of Silicon Nitride are not affected.

Considering now block 265, the nozzles of the Argon are closed and the Oxygen is injected again into the chamber (for example, at a side flow rate of 110 sccm). The wafer is then de-chucked at block 270 removing the direct voltage from the ESC; at the same time, an oxide layer is also deposited on the film of Silicon Nitride. This step is commonly carried out switching off both the top power source and the side power source (since they do not affect the electrical characteristics of the film of Silicon Nitride). Descending into block 275, the wafer is lifted and removed from the chamber. The process then ends at the final block 280.

In sharp contrast to the solutions known in the art, the film of Silicon Nitride obtained with the process described above is far away from having a stoichiometric composition; conversely, this film includes a relatively high amount of Hydrogen. For example, the composition of the Silicon Nitride (measured using the RBS-ERDA method) is:

Si=32–36%

N=47–51%

H=15–19%

It should be noted that the deposited film is Nitrogen-rich; as a consequence, the Hydrogen is present in the form N—H and not in the form Si—H (which bond is easier to be broken, thereby resulting in an undesired migration of the Hydrogen).

Experimental results have shown that the film of Silicon Nitride has good morphological and electrical qualities.

Particularly, a bottom coverage rate is very high (about 80–85%), with an acceptable side coverage rate at the same time (about 40–45%). Moreover, the thickness of the film is quite uniform; for example, the spread of the thickness (measured with the 13 points method) in the same wafer is about 4–4.5%, whereas the spread in different wafers is about 8–9%. The film so obtained also has an acceptable compressive stress (about $0.8\text{–}1.2e^{10}$ dyne/cm$^2$).

At the same time, the film has a high breakdown strength (measured as a total charge to breakdown, or QBD). For example, the QBD of tunnel oxides, low-power P-well transistors, low-power and high-power N-well transistors is substantially the same as the one obtained with the standard processes currently used; only the QBD of the high-power P-well transistors is slightly reduced (but in any case far less than in the other HDP CVD processes known in the art). Moreover, the film of Silicon Nitride does not significantly affect the threshold voltage of the transistors wherein it is included. Only the threshold voltage of the P-well transistors (either low-power ones or high-power ones) is slightly increased (but only when the transistors have a relatively short channel); in any case, the increase is far lower than the one experienced with the other HDP CVD processes known in the art.

Similar considerations apply if the gases are provided at different flow rates, if alternative precursor components of the Silicon Nitride and/or different dilution gases are used, if the reactor works with different pressures, if the deposited film has another composition, if the morphological and/or electrical properties of the film have different values, and the like.

More generally, an embodiment of the present invention proposes a high-density plasma process for depositing a layer of Silicon Nitride on a substrate in a plasma reactor. The process starts with the step of providing a gas including precursor components of the Silicon Nitride; a plasma is then generated applying a radio-frequency power to the gas. The plasma reacts with the substrate to deposit the layer of Silicon Nitride. In the process according to this embodiment of the present invention, the power applied to the gas is in the range from 2.5 kW to 4 kW.

The layer of Silicon Nitride deposited with the proposed process features good morphological properties. Particularly, the Silicon Nitride has a very high filling capability and a quite low (compressive) stress.

At the same time, the layer of Silicon Nitride features improved electrical qualities. In detail, the layer provides a good breakdown strength of the active oxides; moreover, the threshold voltage of the transistors including this Silicon Nitride layer is not substantially affected. Therefore, the electrical properties of the Silicon Nitride are acceptable in most of the practical applications.

The preferred embodiment of the invention described above offers further advantages.

Particularly, the power applied to the gas is in the range from 2.9 kW to 3.2 kW.

This interval provides the best performance of the devised process.

Advantageously, the power is shared between the side power source and the top power source with a ratio in the range from 2.1 to 2.5.

The proposed ratio (in contrast to the standard one of 2) has been found to improve the uniformity of the plasma, and then the characteristics of the deposited film.

Particularly, the ratio is in the range from 2.2 to 2.4.

This interval further improves the performance of the process.

As an additional enhancement, the flow rates of the Silane and of the Nitrogen are in the range from 80% to 95% of their rated values (in contrast to the standard values of 50–60%).

The increased flow rates of the Silane and of the Nitrogen further reduce the stress of the film.

However, the process according to this embodiment of the present invention leads itself to be implemented applying a power to the gas having a value that is outside the preferred range, sharing the power between the side source and the top source in another way, and also with different flow rates of the Silane and of the Nitrogen.

Preferably, the wafer is cooled during the deposition phase.

This additional step reduces the spread of the characteristics of the film, thereby improving the overall yield of the deposition process.

In a particularly advantageous embodiment of the invention, the wafer is heated-up with an Oxygen-based plasma.

The use of the Oxygen avoids unwanted interactions between the film of Silicon Nitride and superficial layers of the wafer; for example, this interaction may cause the creation of bubbles and delamination of any layer of Tungsten Silicide ($WSi_2$). Moreover, the resulting oxide layer acts as a liner, which protects the wafer before the deposition phase.

As a further enhancement, the plasma is stricken only once (before the heating-up of the wafer).

Experimental results have shown that this feature reduces the threshold voltage of the transistors including the film of Silicon Nitride. Moreover, this avoids the striking of the plasma at low pressure (before the deposition phase), which striking can damage the wafer. The fact that the precursor components of the Silicon Nitride are injected into the chamber of the reactor with the top and side power sources on reduces the uniformity of the deposited film; however, this does not affect its electrical characteristics.

Preferably, the wafer is also cooled during the heat-up phase.

Surprisingly, it has been discovered that this additional step has a beneficial effect on the threshold voltage of the transistors including the film of Silicon Nitride.

A way to further improve the solution is to de-chuck the wafer using an Oxygen-based plasma.

The use of Oxygen for the de-chucking reduces any superficial defects on the wafer caused by the plasma (since the Oxygen is lighter than the Argon, and then it does not penetrate into the wafer). Moreover, the resulting oxide layer acts as an additional liner that seals the film of Silicon Nitride. This oxide liner is of very high quality (since it is obtained directly from the Silicon of the deposited film), and further improves the breakdown strength of the film of Silicon Nitride.

Alternatively, the wafer is not cooled during the heat-up phase (thereby improving the characteristics of the corresponding oxide liner) or it is never cooled, the heating-up of the wafer is carried out in an Argon-based plasma, the plasma is stricken twice (before the heating-up of the wafer and before the deposition of the film), the de-chucking is carried out in an Argon-based plasma, and the like.

Naturally, in order to satisfy local and specific requirements, a person skilled in the art may apply to the solution described above many modifications and alterations all of which, however, are included within the scope of protection of the invention.

What is claimed is:

1. A high-density plasma process for depositing a layer of Silicon Nitride on a substrate in a plasma reactor, the process including the steps of:

providing a gas including precursor components of the Silicon Nitride, generating a plasma by applying a radio-frequency power to the gas, and the plasma reacting with the substrate to deposit the layer of Silicon Nitride, wherein the power applied to the gas is in the range from 2.5 kW to 4 kW, and wherein the process further includes the steps before the deposition of the layer of Silicon Nitride of:

providing a further gas including Oxygen, generating a further plasma from the further gas, and heating up the substrate by means of the further plasma, thereby generating a first oxide liner on the substrate.

2. The process according to claim 1, wherein the power applied to the gas is in the range from 2.9 kW to 3.2 kW.

3. The process according to claim 1, wherein the step of generating the plasma includes:

applying a first radio-frequency power to the gas by means of a first power source, and applying a second radio-frequency power to the gas by means of a second power source, a ratio between the first power and the second power being in the range from 2.1 to 2.5.

4. The process according to claim 3, wherein the ratio between the first power and the second power is in the range from 2.2 to 2.4.

5. The process according to claim 1, wherein the step of providing the gas includes providing each precursor component at a flow rate in the range from 80% to 95% of a corresponding rated value supported by the reactor.

6. The process according to claim 1, further including the step of cooling the substrate during the deposition of the layer of Silicon Nitride.

7. The process according to claim 1, wherein the step of generating the further plasma includes applying the radio-frequency power to the further gas, the radio-frequency power being not removed between the heating up of the substrate and the deposition of the layer of Silicon Nitride.

8. The process according to claim 1, further including the step of cooling a surface of the substrate that is not exposed to the further plasma during the heating up of the substrate.

9. The process according to claim 1, further including the steps after the deposition of the layer of Silicon Nitride of:

providing a still further gas including Oxygen, generating a still further plasma from the still further gas to de-chuck the substrate from an electrostatic chuck, thereby generating a second oxide liner on the layer of Silicon Nitride.

* * * * *